United States Patent
Thadesar et al.

(10) Patent No.: US 10,330,874 B2
(45) Date of Patent: Jun. 25, 2019

(54) MIXED-SIGNAL SUBSTRATE WITH INTEGRATED THROUGH-SUBSTRATE VIAS

(71) Applicant: Georgia Tech Research Corporation, Atlanta, GA (US)

(72) Inventors: Paragkumar Thadesar, Atlanta, GA (US); Muhannad S. Bakir, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 2 days.

(21) Appl. No.: 15/423,420

(22) Filed: Feb. 2, 2017

(65) Prior Publication Data

US 2017/0223825 A1 Aug. 3, 2017

Related U.S. Application Data

(60) Provisional application No. 62/290,072, filed on Feb. 2, 2016.

(51) Int. Cl.
*H05K 1/11* (2006.01)
*G02B 6/43* (2006.01)
(Continued)

(52) U.S. Cl.
CPC .......... *G02B 6/43* (2013.01); *H01L 21/76898* (2013.01); *H01L 23/147* (2013.01); *H01L 23/481* (2013.01); *H01L 23/49827* (2013.01)

(58) Field of Classification Search
CPC ...... H05K 1/115; H05K 1/0274; H05K 1/162; H05K 3/0094; G02B 6/43;
(Continued)

(56) References Cited

U.S. PATENT DOCUMENTS 4,209,481 A * 6/1980 Kashiro ................. B29C 70/14
264/108
8,294,240 B2 10/2012 Nowak et al.
(Continued)

FOREIGN PATENT DOCUMENTS

WO 2014013078 1/2014

OTHER PUBLICATIONS

Thadesar, et al., "Novel Photo-defined Polymer-enhanced Through-silicon Vias for Silicon Interposers," IEEE Transactions on Components, Packaging and Manufacturing Technology, vol. 3, No. 7, pp. 1130-1137 (Jul. 2013).
(Continued)

*Primary Examiner* — Steven T Sawyer
(74) *Attorney, Agent, or Firm* — Troutman Sanders LLP; Ryan A. Schneider

(57) ABSTRACT

Disclosed are a variety of mixed-signal substrates comprising a plurality of photo-defined through substrate vias and methods of making the same. In an embodiment, a mixed-signal substrate can comprise a plurality of trenches embedded in a substrate, a photodefineable polymer within at least a portion of each trench, the photodefineable polymer defining one or more channels within each of the plurality of trenches, and a conductive material filling at least a portion of the one or more channels within the photodefineable polymer to form one or more through substrate vias. The photo-defined through substrate vias can comprise a variety of arrangements, numbers of vias, shapes, and dimensions across a single substrate.

18 Claims, 18 Drawing Sheets

(51) Int. Cl.
  *H01L 21/768* (2006.01)
  *H01L 23/14* (2006.01)
  *H01L 23/48* (2006.01)
  *H01L 23/498* (2006.01)

(58) Field of Classification Search
  CPC ............. H01L 21/76898; H01L 23/147; H01L 23/481; H01L 23/49827
  See application file for complete search history.

(56) References Cited

U.S. PATENT DOCUMENTS

| | | | | |
|---|---|---|---|---|
| 2004/0245634 | A1* | 12/2004 | Kloster | H01L 25/0657 257/750 |
| 2005/0077542 | A1* | 4/2005 | Asai | G01R 1/07371 257/200 |
| 2006/0097365 | A1* | 5/2006 | Song | H01L 23/3128 257/666 |
| 2006/0099801 | A1* | 5/2006 | Cranmer | H01L 21/486 438/637 |
| 2011/0012248 | A1* | 1/2011 | Reichenbach | B81C 1/00301 257/680 |
| 2015/0027762 | A1* | 1/2015 | Shin | H05K 1/112 174/257 |
| 2015/0109775 | A1* | 4/2015 | Schwalenberg | F21V 23/0457 362/231 |

OTHER PUBLICATIONS

Jacquinot, et al., "Characterization, Modeling and Optimization of 3D Embedded Trench Decoupling Capacitors in Si-RF Interpser," Proc. 63rd IEEE Electronic Components and Technology Conference (ECTC), Las Vegas, NV pp. 1372-1378 (May 2013).

* cited by examiner

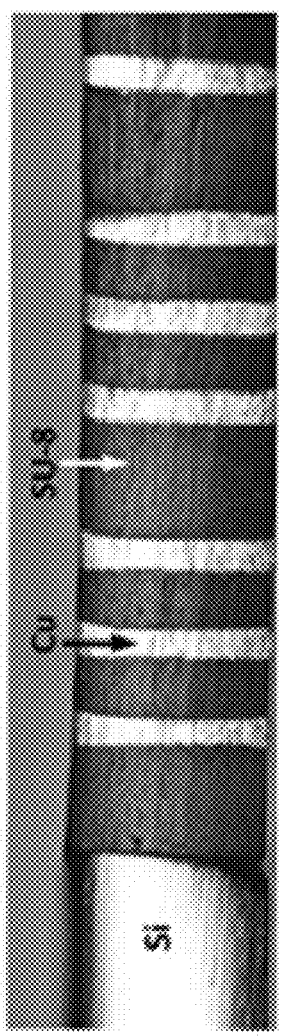
FIG. 9b
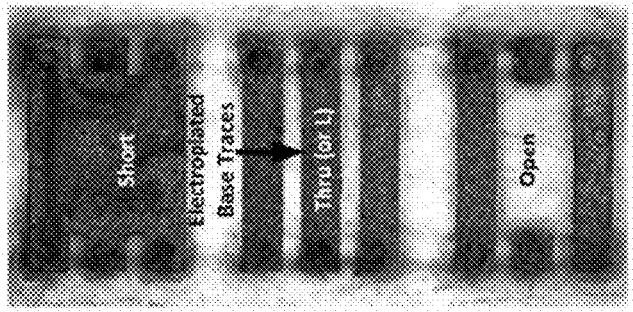
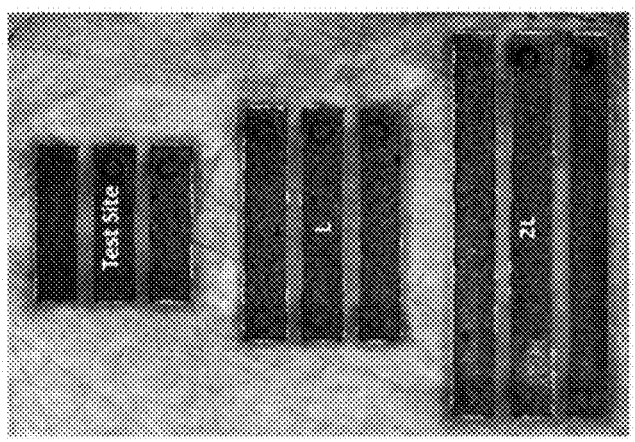
FIG. 9c
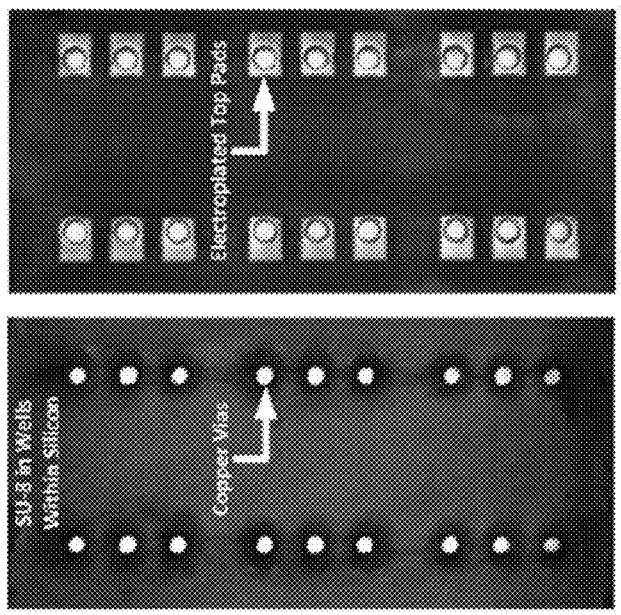

TSV 1 Chain

TSV 3 Chains

MIXED-SIGNAL SUBSTRATE WITH INTEGRATED THROUGH-SUBSTRATE VIAS

CROSS-REFERENCE TO RELATED APPLICATIONS

This application, filed Feb. 2, 2017, claims the benefit of U.S. Provisional Patent Application No. 62/290,072, filed Feb. 2, 2016, entitled "Mixed-signal Substrate with Integrated Through-substrate Vias and Deep-trench Decoupling Capacitors," the entire contents and substance of which is hereby incorporated by reference as if fully set forth below.

TECHNICAL FIELD

The various embodiments of the disclosure relate generally to mixed-signal substrates comprising various through-substrate via arrangements and methods of fabricating the same. The disclosed mixed-signal substrates are useful for a variety of applications, including mixed-signal silicon interposers.

BACKGROUND

Substrates with dense fine-pitch metallization and through-substrate vias have been explored for a variety of applications, including silicon interposers for use in high-bandwidth density communication between heterogeneous integrated circuits (ICs). Silicon interposers, for instance, provide an ability to integrate a variety of micro-electronic structures, such as integration of through-silicon vias to enable a variety of electronic functions and in some instances improve electrical performance. For the integration of more functionality in substrates, large-area silicon interposers are desired. Greater silicon thickness (larger than 300-400 µm) is desired as well for large-area interposers to minimize warpage and bow and improve mechanical stability. However, increasing substrate thickness can result in increased via length, leading to increased via capacitance and radio frequency (RF) losses. Conventionally, to combat this issue, high-resistivity silicon has been used. However, high resistivity silicon is expensive as compared to low resistivity silicon. In addition, the mismatch between the coefficient of thermal expansion (CTE) for copper and silicon can result in high through substrate via stresses. These factors drive the need for low-loss via technologies for large-area, thick interposers to compensate for this increased length while minimizing production cost.

To address these issues, polymer-enhanced, photo-defined electrical and optical through substrate vias have been proposed, including polymer-clad through-substrate vias and polymer-embedded through-substrate vias. Including a photodefineable polymer coating the through substrate via can decrease through substrate via capacitance and RF losses, which often plague previous high aspect ratio materials. Yet, known substrates having photo-defined through substrate vias were restricted to specific fabrication processes and lacked customizability needed to support a variety of applications, such as mixed-signal interposers.

BRIEF SUMMARY

The various embodiments of the present disclosure relate to mixed-signal substrates comprising various via arrangements and methods of fabricating the same. Embodiments of the present disclosure can include a mixed-signal substrate comprising a plurality of trenches embedded in a substrate, each trench of the plurality of trenches extending from an upper surface of the substrate to a lower surface of the substrate; a photodefineable polymer within at least a portion of each trench, the photodefineable polymer defining one or more channels within each of the plurality of trenches; and a conductive material filling at least a portion of the one or more channels within the photodefineable polymer to form one or more through substrate vias. In some embodiments, a first trench of the plurality of trenches can include a different number of through substrate vias than at least a second trench. In some embodiments, the first trench can comprise a different via arrangement than the second trench. As such, in some embodiments, the via arrangement can be selected from a group consisting of: a post via arrangement, a coaxial via arrangement having a solid ring via, a coaxial via arrangement having a meshed via ring, a via bundle, and an optical via, so long as at least another arrangement is something other than a post via.

In some embodiments the mixed-signal substrate can comprise an optical via embedded within the substrate.

In embodiments wherein at least the first trench comprises a via bundle, the via bundle can be metal-plated to form a high-density decoupling capacitor. Additionally, the one or more through substrate vias in the via bundle can comprise at least one metal and at least one high-k dielectric material.

In some embodiments, the mixed-signal substrate can comprise a via arrangement wherein a first through substrate via in the first trench has a greater width than at least a second through substrate via in the second trench. In some embodiments, the mixed-signal substrate can comprise a plurality of via arrangements wherein a first trench of the plurality of trenches can include a through substrate via having a different two-dimensional shape than at least a through substrate via in the second trench. In some embodiments, at least one trench of the plurality of trenches can comprise a coaxial via arrangement. In embodiments comprising a coaxial via arrangement, the coaxial via arrangement can have an inner through substrate via and a mesh of outer through substrate vias, the mesh of outer through substrate vias disposed coaxially around the inner through substrate via. In some embodiments, at least one trench embedded in the mixed-signal substrate can comprise a post via arrangement, including a central through substrate via having a thick liner composed of a photodefineable polymer.

In some embodiments, the mixed-signal substrate can also comprise one or more through substrate vias coated in silicon dioxide in addition to the via arrangements disclosed above. And, in other embodiments, the substrate can be composed of low-resistivity silicon.

Other embodiments of the present disclosure can comprise a mixed-signal substrate comprising a plurality of trenches embedded in a substrate, each trench comprising one or more through substrate vias extending vertically from a top surface of the substrate towards a bottom surface of the substrate, the one or more through substrate vias filled with a metallic filler and coated with a liner composed of a photodefineable polymer, wherein a first trench of the plurality of trenches comprises a different arrangement of through substrate vias than at least a second trench.

In some embodiments, the first trench and the second trench can each comprise a via arrangement selected from the group consisting of: a post via, a coaxial via arrangement having a solid ring via, a coaxial via arrangement having a meshed ring of through substrate vias, a via bundle, and an optical via, so long as at least another arrangement is something other than a post via. Additionally, in some embodiments, the first trench of the plurality of trenches includes a different number of through substrate vias than at least the second trench Still, in some embodiments, the first trench can include a through substrate via having a different two-dimensional shape than at least a through substrate via in the second trench.

Another embodiment of the present disclosure can comprise a method of fabricating a mixed-signal substrate, the method comprising: etching a plurality of trenches in a substrate; filling each of the plurality of trenches with a photodefineable polymer; patterning the photodefineable polymer in each of the plurality of wells, the patterning comprising forming one or more channels within the photodefineable polymer layer filling each of the plurality of wells; and filling a portion of the one or more channels with a metallic filler to form one or more through substrate vias; wherein patterning the photodefineable polymer comprises patterning a different arrangement of channels in at least a first trench than at least a second trench.

In some embodiments, the first trench and the second trench can comprise a via arrangement selected from the group consisting of: a post via arrangement, a coaxial via arrangement having a solid ring via, a coaxial via arrangement having a meshed ring of through substrate vias, a via bundle, and an optical via, so long as at least another arrangement is something other than a post via. In some embodiments, the step of etching the plurality of trenches in the substrate can comprise one of dry-etching or wet-etching. In some embodiments, at least one trench includes a different number of channels than at least another trench.

Additionally, embodiments of the present disclosure can allow for fabrication of a variety of novel via arrangements. For instance, while mixed-signal substrates are described, the methods described herein can allow for fabrication of a single via arrangement within a substrate. For instance, an embodiment of the present disclosure can comprise a coaxial via structure within a substrate, the coaxial via structure comprising a plurality of through substrate vias surrounded by a photodefineable material, the plurality of through substrate vias including a central via and a grouping of outer vias, the grouping of outer vias disposed coaxially around the central via.

BRIEF DESCRIPTION OF THE DRAWINGS

FIGS. 9b-9c show various cross-sectional views of fabricated vias and de-embedding and time-domain measurement via structures, in accordance with an embodiment of the present disclosure.

DETAILED DESCRIPTION

Figure 1:
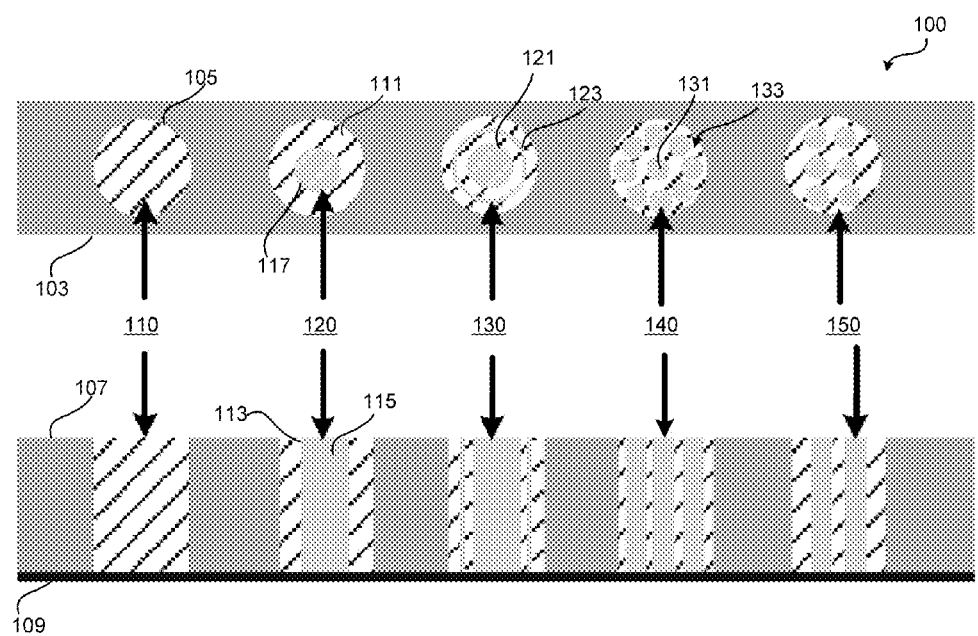
FIG. 1 illustrates various trenches having photo-defined through substrate vias with differing dimensions, arrangements, and functionalities, in accordance with an embodiment of the present disclosure.

Although preferred embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. The disclosure is capable of other embodiments and of being practiced or carried out in various ways. Also, in describing the preferred embodiments, specific terminology will be resorted to for the sake of clarity.

It must also be noted that, as used in the specification and the appended claims, the singular forms "a," "an" and "the" include plural referents unless the context clearly dictates otherwise.

Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Ranges can be expressed herein as from "about" or "approximately" one particular value and/or to "about" or "approximately" another particular value. When such a range is expressed, another embodiment includes from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

Disclosed are various embodiments of a mixed-signal substrate including a plurality of through substrate via (used interchangeably with vias or low-loss vias) arrangements comprising a plurality of photo-defined through substrate vias. As described, embodiments of the mixed-signal substrate can simultaneously include a plurality of photo-defined through substrate vias having varying via arrangements, dimensions, and functions across the same substrate. Previously, fabrication of substrates having photo-defined through substrate vias was restricted to specific process and lacked customizability. For instance, processes for via formation required etching by dry-etch methods, like the Bosch process. For platforms like silicon interposers, dry-etch methods used for via etching are highly aspect-ratio-dependent, (i.e. smaller diameter openings take longer to etch through) and are expensive. Reducing the dependence on dry etching processes can reduce the cost of fabricating via arrangements like through substrate vias for 2.5-dimensional and 3-dimensional integration of microelectronics chips. Additionally, simultaneous fabrication of varying via arrangements, characterized by differences in via dimensions, numbers, shapes, patterns, and/or functions can reduce production costs while increasing the electrical functionality and performance of substrates which are useful in a variety of applications. Moreover, the techniques and methods described below can provide for creation of a variety of novel via arrangements, including improved coaxial vias and high-density de-coupling capacitors.

Disclosed are various via arrangements that can be implemented in a variety of applications, including mixed-signal substrates. A mixed-signal substrate can include a different via arrangements implemented in a single substrate. As will be understood via arrangement can refer to a singular photo-defined through substrate via or grouping of photo-defined through substrate vias. Additionally, via arrangements can be characterized by a variety of properties including but not limited to via size or dimensions, 2-dimensional shape, the number of vias in a trench, the spatial relationship of the vias, patterns or pitches.

Additionally, the substrates disclosed can include substrates composed of a variety of materials known in the art. For instance, in some embodiments, the disclosed mixed-signal substrate can comprise a silicon substrate, for instance, a large-area silicon substrate composed of low-resistivity silicon. While in some instances specific mention is made to silicon substrates, those skilled in the art will understand that there are various commercially available silicon substrates composed of different varieties of silicon. Additionally, aspects of the present disclosure are not limited to applications having a silicon substrate and can include substrates composed of a variety of materials known in the art.

Moreover, while specific mention is made to mixed-signal substrates, as discussed below, the methods and techniques described herein can be formed independently within a substrate. Meaning, a substrate may also comprise a single via arrangement.

Figure 2:
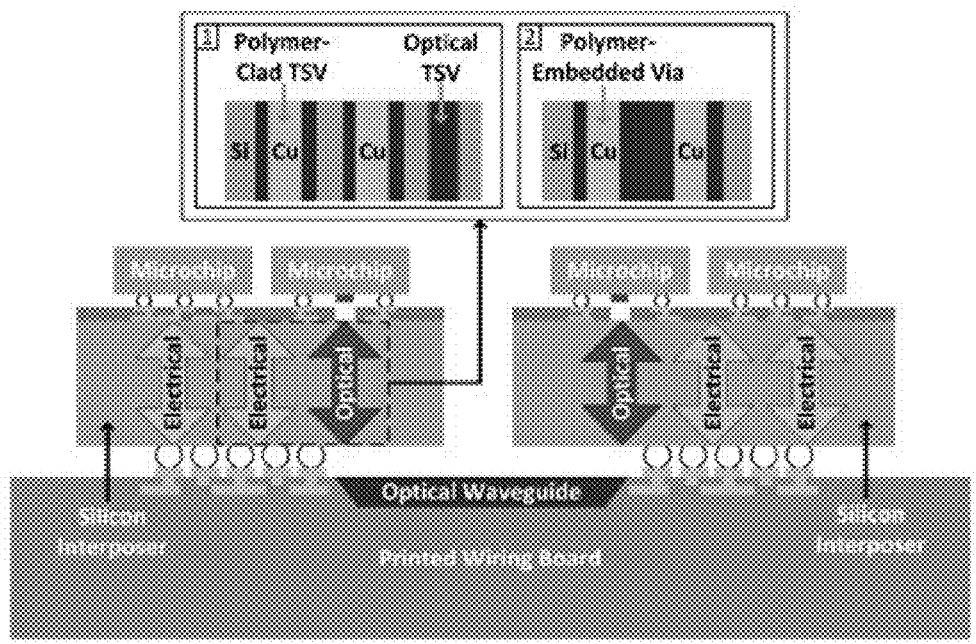
FIG. 2 illustrates a nonlimiting exemplary interposer platform for incorporating various via arrangements to obtain mixed-signal functionality, in accordance with an embodiment of the present disclosure.

FIG. 1 illustrates various types of via arrangements that can be implemented in a variety of applications including, for example, a mixed-signal substrate, including the interposer platform as illustrated at FIG. 2. As will be understood different via arrangements can provide various electrical functions, and including different via arrangements in a single substrate can provide for multi-signal capabilities and functioning. In an embodiment, as illustrated at FIG. 1, mixed-signal substrate 100 can comprise a variety of via arrangements (e.g. 110, 120, 130, 140, 150) each via arrangement comprising a trench 105 through a substrate 103, one or more channels 113 filled with a conductive material 115 to form a through substrate via, and each through substrate via coated in a photodefineable polymer 111 within the trench 105. While FIG. 1 depicts various types of via arrangements, a mixed-signal substrate is not so limited and may include various combinations of the via arrangements depicted and also through substrate via arrangements not depicted, as discussed in more detail below.

As such, the mixed-signal substrate can comprise a plurality of trenches 105 embedded in the substrate 103, as illustrated at FIG. 1. As used herein, trench can refer to a portion of the substrate that is etched or otherwise removed and is broad enough to include trenches of various sizes and shapes and include deep trenches and wells. In some embodiments, each trench 105, of the plurality of trenches can be etched into the substrate 103 and extend in a vertical direction through the volume of the substrate 103 from an upper surface of the substrate 107 to a lower surface of the substrate 109. For instance, each trench 105 can comprise larger-dimension openings and be obtained using either wet or dry-etch methods. Each trench can comprise one or more via arrangements.

Additionally, as illustrated in FIG. 1, each trench 105 of the plurality of trenches can be at least partially filled with a photodefineable polymer 111 (indicated by the single-hash markings in FIG. 1). The photodefineable polymer 111 can comprise any photoresist known in the art capable of high aspect ratio photo-definition using photolithography techniques. For instance, in an exemplary and non-limiting embodiment, the photodefineable polymer 111 can be SU-8. In other embodiments, the photodefineable polymer may include one or more benzocyclobutene (BCB) polymers.

The photodefineable polymer 111 can at least partially fill each trench 105 of the plurality of trenches. In some embodiments, as illustrated at FIG. 1, the photodefineable polymer 111 can define one or more channels 113 within each trench 105 of the plurality of trenches. The one or more channels 113 can extend from the upper surface 107 of the substrate 103 to a bottom surface 109 of the substrate 103. In some embodiments, at least a portion of the one or more channels 113 can be filled with a conductive filler 115. For example, the conductive filler 115 can be any conductive material, including conductive metals, such as copper. In some embodiments, filling the vias can be obtained using either bottom-up or superfill electroplating of an electrically conductive material like copper.

Figure 5:
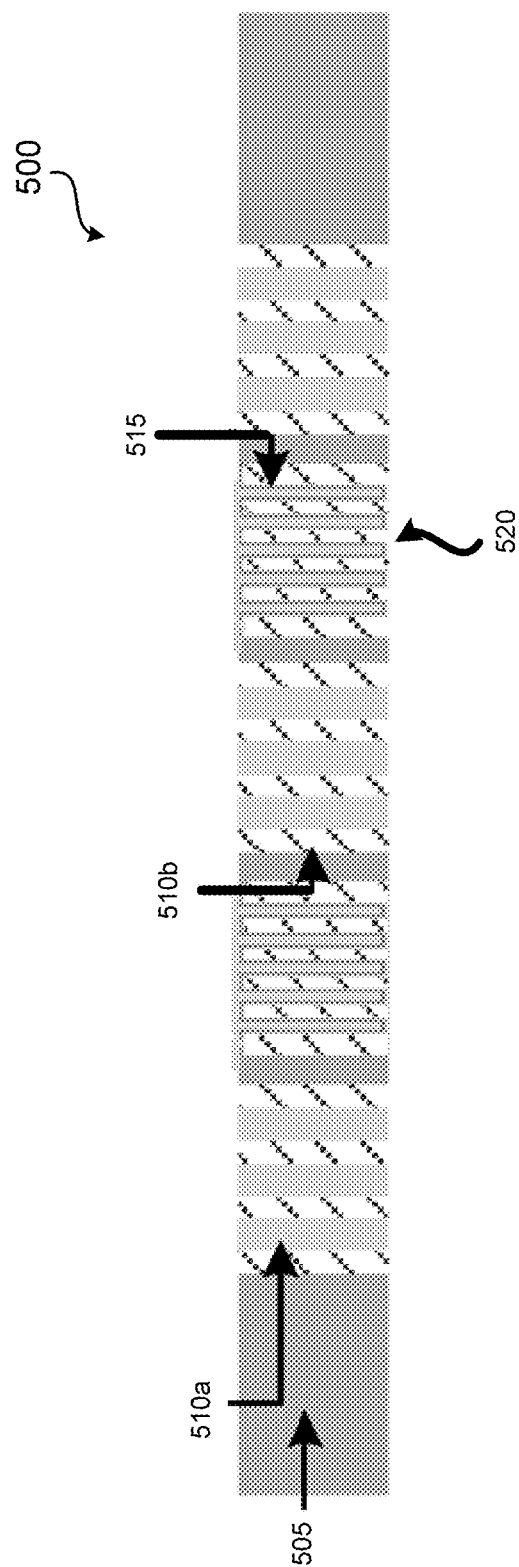
FIG. 5 illustrates a mixed-signal substrate comprising photo-defined vias and photo-defined deep-trench decoupling capacitors, in accordance with an embodiment of the present disclosure.

The disclosed mixed-signal substrates can comprise a variety of via arrangements characterized by individual photo-defined through substrate vias having various dimensions, patterns, shapes, pitches, and functions. As such, various via arrangements can be fabricated simultaneously across a length of a substrate. FIG. 1 illustrates various via arrangements that can be obtained in a substrate. For example, FIG. 1 illustrates an optical via 110 for optical communication, a post via 120, a coaxial via arrangement with a solid ring via 130, a coaxial via arrangement with a meshed ring 140, and a via bundle 150. In some embodiments, the via bundle 150 arrangement can be used in formation of high-density decoupling capacitors, as illustrated at FIGS. 5-6*c*, and discussed in further detail below. The ability to create varying via arrangements across the same substrate can allow for mixed-signal functioning capabilities since via arrangements having different patterns or numbers of through substrate vias or through substrate vias having varying dimensions, or shapes can facilitate various electronic functionalities.

Additionally, via arrangements can be characterized by a variety of properties including but not limited to via size or dimensions, 2-dimensional shape, the number of vias in a trench, the spatial relationship of the vias, or pitch. For instance, the through substrate vias contained in a via arrangement can be a variety of shapes. As used herein, the shape of the through substrate via can be the two-dimensional shape formed at any cross-section along a 3-dimensional portion of the through substrate via. The two-dimensional shape can be any geometric shape including, for example, circular, rectangular, square, or other polygons. Additionally, the plurality of vias within a via arrangement can be tapered as the through substrate via extends through the volume of the substrate. In some embodiments, the plurality of through substrate vias in each via arrangement can be a variety of dimensions, as indicated by increases or decreases in diameter or width of the through substrate vias.

Embodiments of the presently disclosed mixed-signal substrates can comprise one or more optical through substrate vias 110. Optical through substrate vias 110 can facilitate, for example, vertical optical communication in interposer stack platforms. In some embodiments, the one or more optical through substrate vias 110 can be filled with two dielectrics. For instance, the one or more optical through substrate vias 110 can include a core composed of a dielectric having a high refractive index surrounded by a dielectric having a lower refractive index. In an example embodiment, the optical through substrate via can include a core composed of SU-8 which is clad in silicon dioxide. SU-8, for example, has good optical transmission characteristics (e.g. a high refractive index) in the window of 850-nm wavelength. Cladding an SU-8 core in silicon dioxide can then obtain total internal reflection.

In an exemplary but non-limiting embodiment, optical through substrate vias can be fabricated simultaneously with other via arrangements, such as those depicted in FIG. 1. For instance, an optical through substrate via can be formed by filling the etched trenches in the substrate with a photodefineable polymer, like SU-8, followed by a soft bake similar to the fabrication of polymer-clad through substrate vias, illustrated at FIG. 3*a*-3*c*. However, during the photolithography, the polymer-filled vias intended for optical through substrate vias can be simply flood exposed. As SU-8 is negative tone, the polymer can then remain in the flood-exposed vias at the end of the SU-8 development, yielding the optical through substrate vias. As such, in an exemplary but non-limiting embodiment, 390-µm tall optical through substrate vias can be fabricated with a 118-µm diameter SU-8 core surrounded by a 2-µm thick silicon dioxide cladding.

Embodiments of the presently disclosed mixed-signal substrates may comprise one or more post via arrangements 120. For instance, the post via arrangement 120 can include a through substrate via 117 disposed proximate the center of a trench 105 with a thick liner of photodefineable polymer 111 coating the through substrate via 117. For instance, as illustrated in FIG. 1, the post via arrangement can include a through substrate via composed of a conductive filler 115, such as copper, and can be coated with a photodefineable polymer 111. Conventional through substrate vias include a thin (approximately 1 µm thick) silicon dioxide liner. Including a thick liner of photodefineable polymer can reduce through substrate via dielectric capacitance and through substrate via loss. In some embodiments, the thick liner of the photodefineable polymer can be greater than 1 µm. For instance, in an exemplary but non-limiting embodiment, the liner can be approximately 20 µm thick.

Embodiments of the presently disclosed mixed-signal substrates 100 may comprise one or more coaxial via arrangements with a solid ring via 130, as illustrated in FIG. 1. The coaxial via arrangement with the solid ring via 130 can comprise an inner through substrate via 121 disposed proximate a center portion of the trench 105 and a solid ring-shaped via 123 disposed coaxially around the inner through substrate via 121. In other words, the coaxial via arrangement with the solid ring via 130 can comprise at least two through substrate vias: an inner through substrate via 121 and a ring-shaped through substrate via 123.

In other embodiments, the mixed-signal substrates can comprise one or more coaxial through substrate via arrangements with a meshed through substrate via ring 140, as shown at FIG. 1. In some embodiments, the coaxial through substrate via arrangement with the meshed through substrate via ring 140 can comprise a central through substrate via 131 and a plurality of through substrate vias 133 disposed coaxially around the central through substrate via 131. It will be understood that the meshed via ring can comprise any number of individual vias, depending on the application and functioning desired, and the pitch between the central via and the coaxial mesh vias can be adjusted as desired. Additionally, the size of the individual vias within the coaxial via arrangement 140 can be altered as desired.

Coaxial via arrangements, such as the coaxial via arrangement with the meshed vias 140 can be particularly applicable in controlling impedance in high-frequency applications. Additionally, such arrangements can comprise a variety of manufacturing advantages in addition to improving electrical performance. For instance the methods and techniques for fabricating via arrangements disclosed herein can allow for creation of impedance-controlled structures, such as the coaxial via with a meshed via ring with significant ease. Such arrangements are additionally advantageous because coaxial via structures having a meshed via ring can improve broadband controlled impedance and loss reduction.

Embodiments of the presently disclosed mixed-signal substrates can comprise one or more via bundles 150 for use in formation of high-density decoupling capacitors, as illustrated at FIGS. 5-6*c*. For instance, the via bundle can comprise a plurality of vias having high aspect ratios and demonstrating a low-pitch relationship.

Figures 3A, 3B, 3C, 3D:
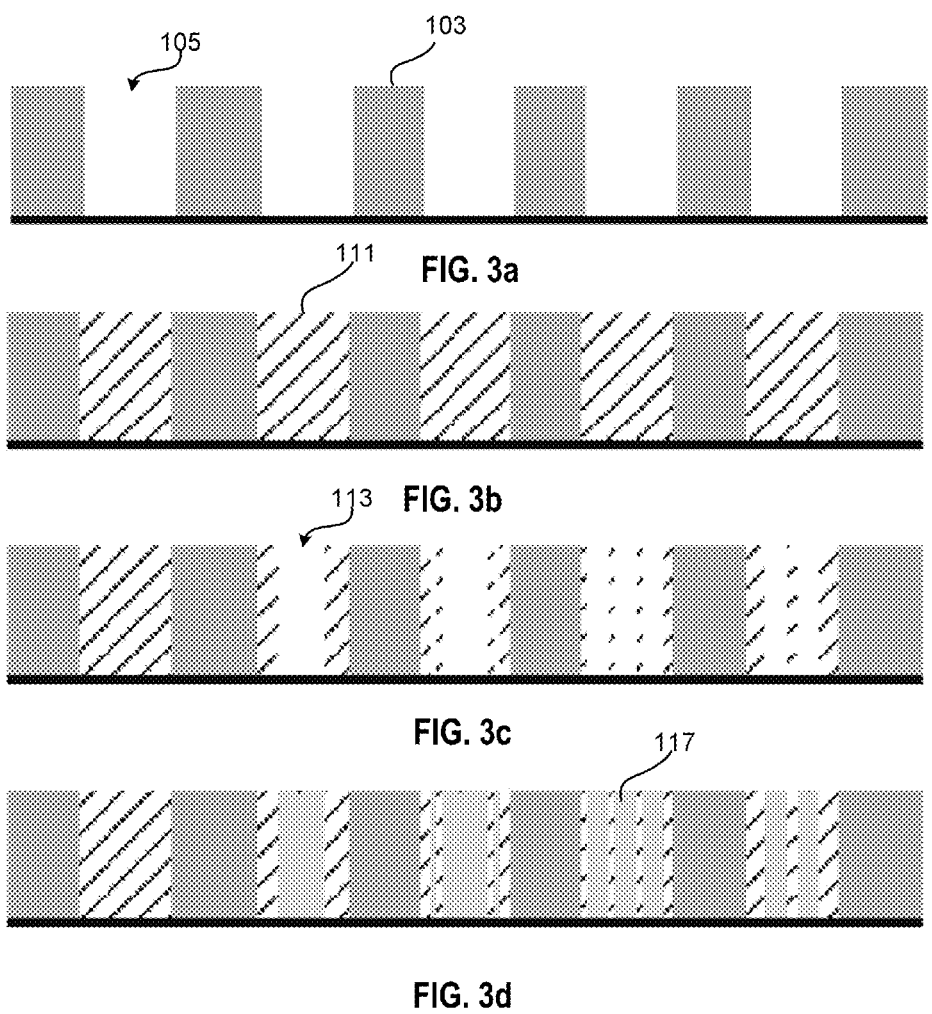
FIGS. 3a-3d illustrate a method of fabricating a mixed-signal substrate, in accordance with an embodiment of the present disclosure.

FIGS. 3*a*-3*d* illustrate an exemplary and non-limiting embodiment of a method for fabricating a plurality of via arrangements in a substrate. As shown at FIG. 3*a*, a plurality of trenches 105 can be etched in a substrate 103 comprising a dielectric or metal disposed on one side. In some embodiments, etching can be performed using either dry-etching methods, like the Bosch process, and in other embodiments, etching can be performed using wet-etching methods. Then, as shown at FIG. 3*b*, the plurality of trenches 105 can be filled with a photodefineable polymer 111. As discussed previously, the photodefineable polymer 105 can comprise any photoresist capable of high aspect ratio photo-definition, such as SU-8. Following, as illustrated at FIG. 3c, wafer-level photolithography can be performed to obtain various through-substrate channels 113 having varying arrangements or dimensions, including a different number of channels, channels having different widths, two-dimensional shapes, or the variety of via arrangements described above with respect to FIG. 1. Then, metal filling can be performed to fill the plurality of channels 113, as illustrated at FIG. 3d to form a plurality of through substrate vias 113. As will be understood, any filling method can be performed including superfilling or bottom-up electroplating. Once the channels are filled with the conductive filler, chemical-mechanical polishing can be performed to remove additional plated metal on the top of the substrate.

Figure 4:
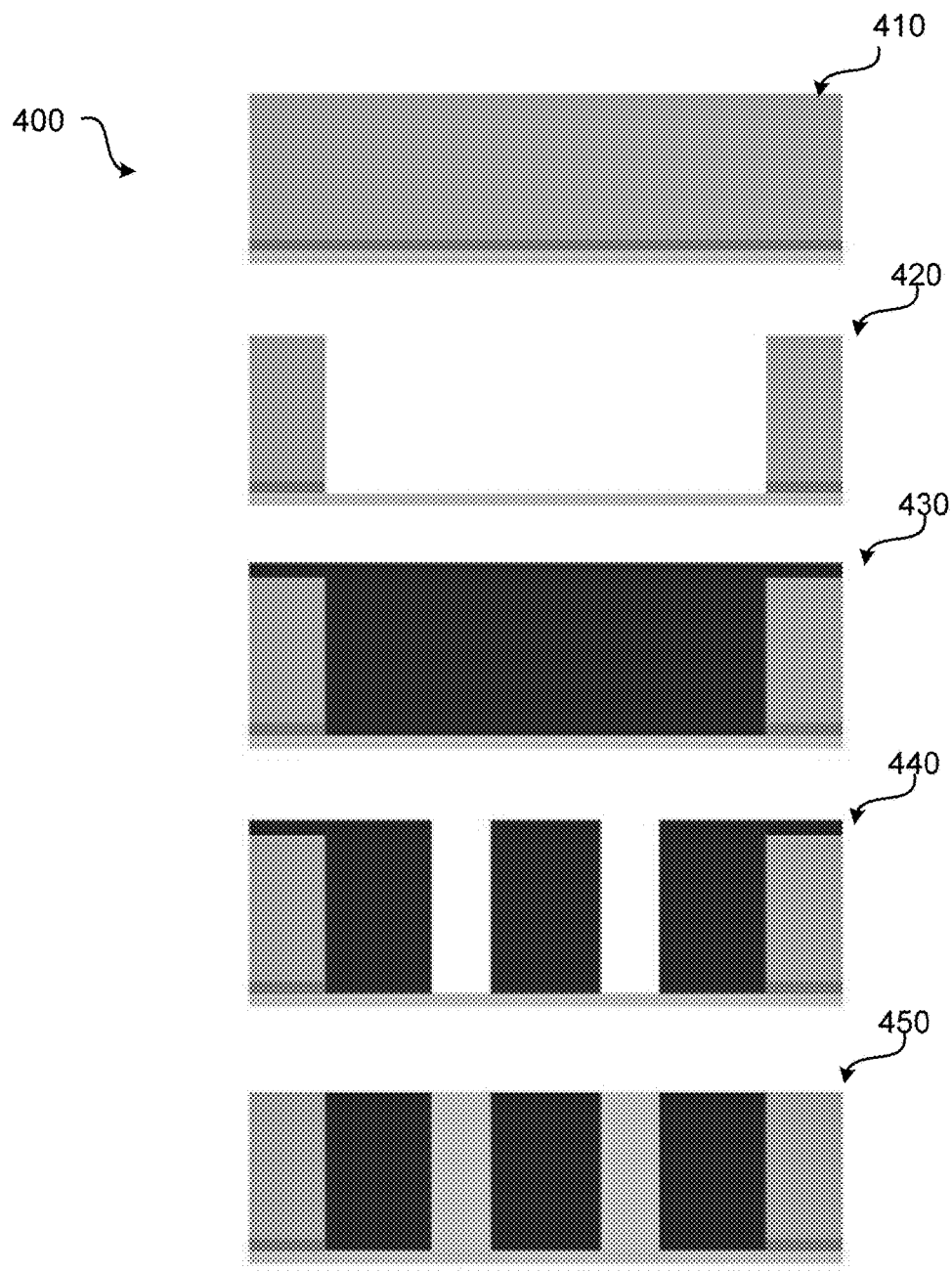
FIG. 4 illustrates a method of fabricating photo-defined through substrate vias and via arrangements, in accordance with an another embodiment of the present disclosure.

FIG. 4 illustrates another method of making 400 a variety of photo-defined via arrangements. As shown in FIG. 4, the fabrication of polymer-embedded vias can begin with the deposition of silicon dioxide, a metal seed layer, and a conductive material on one side of a substrate 410. In some embodiments, the metal seed layer can comprise titanium to promote adhesion and the conductive material can comprise copper. Next, larger trenches can be etched in the silicon wafer using a photoresist mask 420. After silicon etching, the silicon dioxide and seed layer are etched using a buffered oxide etch. Next, a photodefineable polymer can be spin coated on the substrate to fill the trenches 430 followed by a soft bake and UV exposure of the channels in the trenches filled with photodefineable polymer. Once a post exposure bake is completed, development of the photodefineable polymer is performed yielding channels in the SU-8-filled trenches 440. The fabricated channels may have tapered sidewalls, resulting in greater diameter at the base of the channels. Following channel development, bottom-up copper electroplating of the channels is performed 450, followed by chemical-mechanical polishing to remove any additional plated metal on the top of the substrate. As such, in some embodiments, multiple, varying via arrangements can be fabricated within each trench, like those discussed above with respect to FIG. 1. In addition to the method steps described above, in some instances, perforations or microvias can be added at the bottom of the larger trenches before spin coating with the photoresist.

FIG. 5 illustrates a mixed-signal substrate 500 having a plurality of via arrangements (510a, 510b, 515). In some embodiments, mixed-signal substrates having a plurality of via arrangements (510a, 510b) as discussed above can comprise at least one via arrangement comprising a high-density decoupling capacitor 515, as illustrated at FIG. 5. The high-density decoupling capacitor 515 can be fabricated simultaneously with other via arrangements 510a, 510b, such as those described with respect to FIG. 1. As will be understood, including a high-density decoupling capacitor can provide for mitigating power supply noise. The described high-density decoupling capacitors can be formed in a through substrate via bundle 520, such as the through substrate via bundle illustrated at FIG. 1. Via bundle arrangements 520 can be fabricated in a substrate 505 as discussed above with respect to FIGS. 3a-3c followed by serial deposition of a metal, a high-k dielectric, and a metal over the vias to obtain a capacitance density greater than 5 $\mu$F/cm$^2$ (for ~10 $\mu$m diameter and 300 $\mu$m tall vias in polymer trenches at a 20 $\mu$m pitch and a high-k dielectric like HfO$_2$). Therefore, the plurality of decoupling capacitors 515 can comprise a plurality of high-aspect-ratio through substrate vias (or a via bundle 520) having low-pitch relationships and coated with a photodefineable polymer (indicated by single hash marks).

Figure 6A:
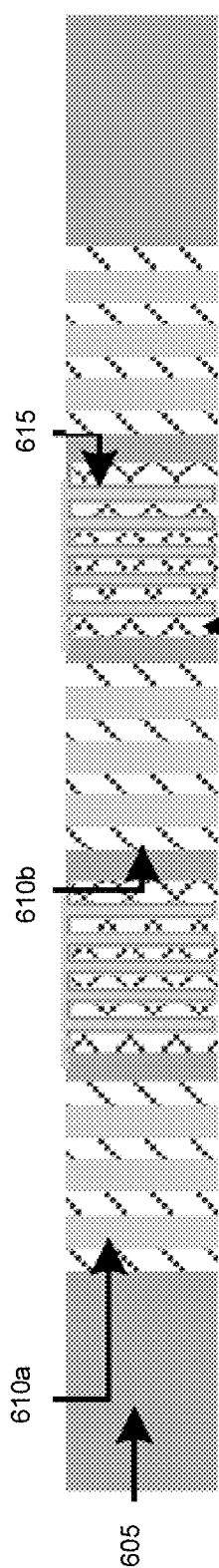
FIGS. 6a-6c illustrate various mixed-signal substrates comprising photo-defined vias and photo-defined/non-photo-defined deep-trench decoupling capacitors, in accordance with an embodiment of the present disclosure.
Figure 6B:
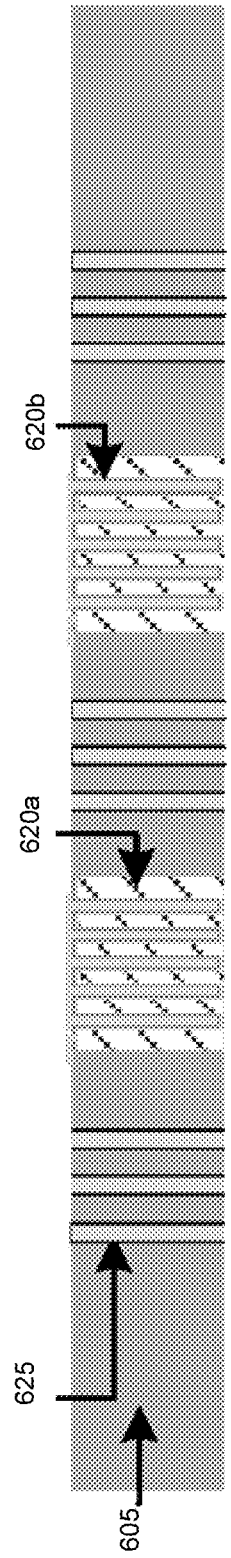
Figure 6C:
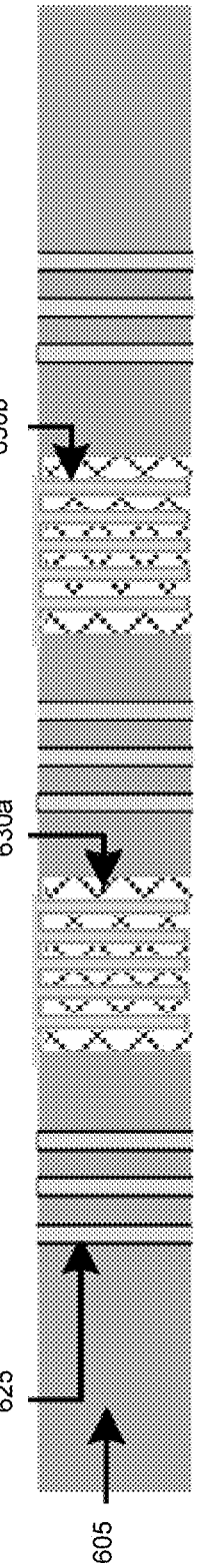

In some embodiments, photo-defined through substrate vias and deep-trench decoupling capacitors, as discussed previously, can be integrated in substrate 605 comprising conventional through substrate vias, as illustrated in FIGS. 6a-6c. For instance, a substrate 605 with conventional through substrate vias 625 can be obtained from a foundry. As will be understood, conventional through substrate vias are coated in thin, silicon dioxide liner. FIG. 6a illustrates a substrate 605 obtained from a foundry where conventional through substrate vias are converted into photo-defined through substrate vias and/or deep-trench decoupling capacitors. For instance, such via arrangements can be obtained as described in FIGS. 3a-3c. First, the substrate surrounding conventional through substrate vias 625 can be etched away to obtain conductive pillars surrounded by thin trenches. In other embodiments, trenches can be etched in areas of the substrate where there are not conventional through substrate vias. Then, the thin trenches can be filled with a photo-defined polymer to create a plurality of photo-defined, through substrate vias 610a, 610b, in a variety of arrangements, as discussed above with respect to FIG. 1. In embodiments where conventional through substrate vias were not otherwise embedded in the substrate, the method steps of FIG. 3a-4 can be performed.

Simultaneously, as illustrated at FIG. 6a, one or more decoupling capacitors 615 can be formed. As will be understood, the one or more decoupling capacitors 615 can include a photodefineable polymer or a non-photodefineable polymer (indicated by the double hash marks). In some embodiments, using the methods described with respect to FIGS. 3a-3c, trenches can be formed in the substrate 605 around conventional through substrate vias to form conductive pillars. Then deposition of a dielectric and a metal layer can be performed over the conductive pillars to form a metal-insulator-metal capacitor followed by filling of a polymer material in the decoupling capacitor regions. The ability to modify substrates obtained from the foundry can allow for inclusion of more advanced functionality of the substrates and therefore enhanced system security. As will be understood, since fabricating decoupling capacitors can include metal deposition over pillars, it is a simpler process compared to depositing electrically conductive electrode layers in high aspect ratio etched structures. Additionally, as illustrated at FIG. 6a, the high-density decoupling capacitor can, in some embodiments, include a non-photodefineable polymer (indicated by double-hash marks).

In some embodiments, as illustrated at FIGS. 6b and 6c, the mixed-signal substrate can comprise both conventional through substrate vias, such as vias with a silicon dioxide liner, and photo-defined through substrate vias. For instance, FIG. 6b illustrates a plurality of photo-defined decoupling capacitors 620a,620b fabricated with a plurality of conventional through substrate vias 625. As will be understood, to obtain the via arrangements illustrated in FIG. 6b, decoupling capacitors can be formed by the methods described with respect to FIG. 5. Additionally, FIG. 6c illustrates a plurality of non-photodefined decoupling capacitors 630a, 630b that can be fabricated with a plurality of conventional through substrate vias 625. As will be understood, to obtain the via arrangements illustrated in FIG. 6c, decoupling capacitors can be formed by the methods described with respect to FIG. 6a.

The methods and techniques described above enable the creation of novel, through substrate via arrangements independently within a substrate. For instance, a substrate can comprise a single via arrangement comprising a plurality of through substrate vias coated in a photodefineable material.

Therefore, it is anticipated that such via structures are not only useful in mixed-signal applications as well as single via arrangement.

For instance, in some embodiments, a coaxial via comprising a solid ring via can be fabricated within a substrate. As described above with respect to FIG. 1, the coaxial via arrangement with the solid ring via can comprise at least two through substrate vias: an inner through substrate via and a ring-shaped through substrate via. It is understood that the substrate including a coaxial via arrangement with the solid ring can comprise some or all of the features previously described and be fabricated using the methods or techniques described above.

In some embodiments, a coaxial via arrangement with a meshed via ring can be fabricated within a substrate. As described above with respect to FIG. 1, the coaxial via arrangement with a meshed via ring can comprise a central via and a plurality of outer vias forming a meshed design. It is understood that the substrate including a coaxial via arrangement with the meshed via ring can comprise some or all of the features previously described and be fabricated using the methods or techniques described above.

In some embodiments, a via bundle can be fabricated within a substrate. The via bundle with the meshed substrate can comprise a plurality of vias demonstrating a low-pitch relationship, as described previously. Additionally, such via bundles can be particularly useful in fabricating of the decoupling capacitors described previously. It is understood that the substrate including the via bundle can comprise some or all of the features previously described and be fabricated using the methods or techniques described above.

EXAMPLES

Example 1

The efficacy of fabrication and characterization of a polymer-enhanced and photodefined silicon interposer platform was established based on the following: 1) polymer-embedded via (PEV) fabrication, loss de-embedding up to 30 GHZ, capacitance and conductance extraction, and eye-diagram measurements; and 2) polymer-enhanced coaxial via fabrication and impedance extraction up to 50 GHZ.

Analysis Polymer-Embedded Vias

To compare the high-frequency parasitics of PEVs and through substrate vias with SiO2 liner, an electrical analysis was performed for signal-ground through substrate via pairs. through substrate vias were modeled using resistors and inductors with conductance and capacitances between the signal and ground through substrate vias. For the through substrate vias with $SiO_2$ liner, the path between the signal and ground through substrate vias consists of per-unit-length substrate capacitance $Cu_{sub}$ substrate conductance $Gu_{sub}$, and dielectric capacitances $Cu_{liner}$. For PEVs, the path between the signal and ground through substrate vias consists of only per-unit-length substrate capacitance $Cu_{sub}$ and substrate conductance $Gu_{sub}$, since a dielectric liner is not present.

Figure 7A:
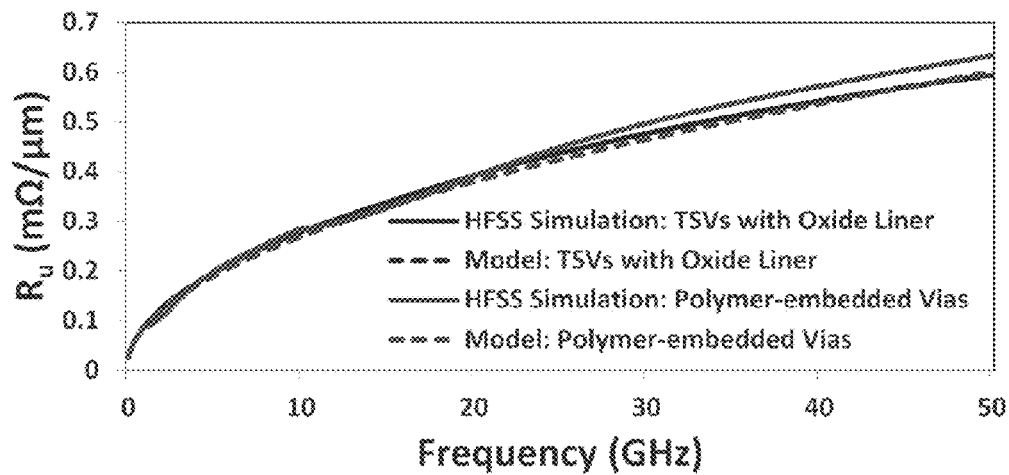
FIGS. 7a-7d are graphical representations evaluating per-unit-length photo-defined through substrate via RLGC values using models and HFSS simulations, in accordance with an embodiment of the present disclosure.
Figure 7B:
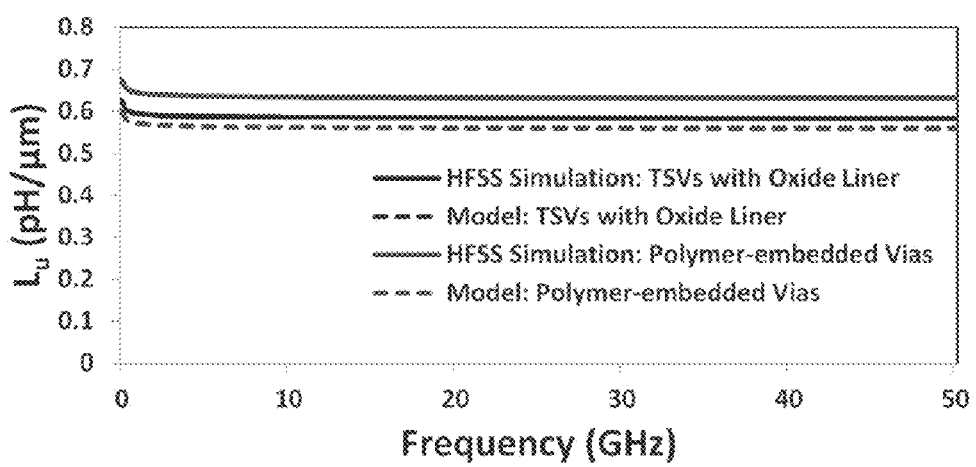
Figure 7C:
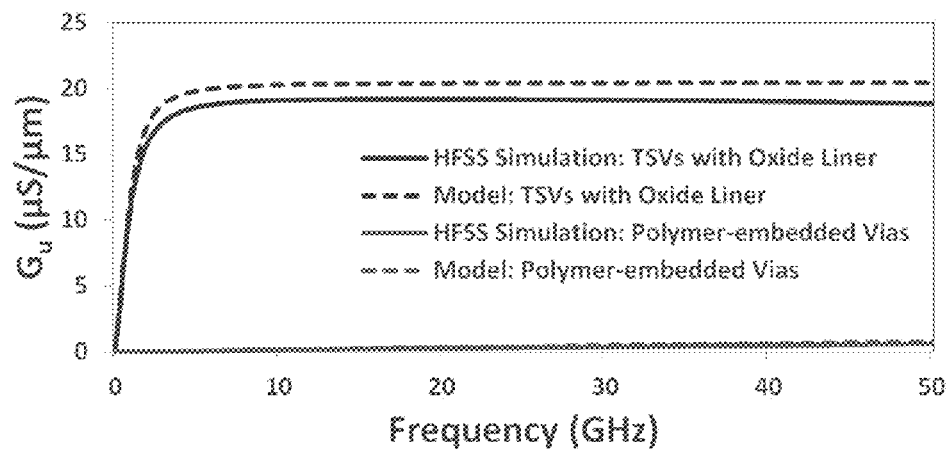
Figure 7D:
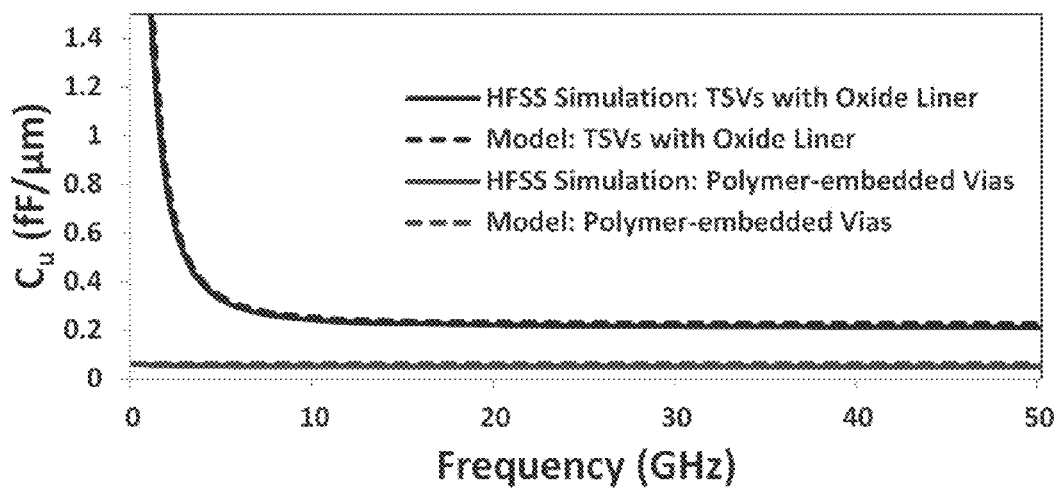

Per-unit-length resistance, inductance, conductance, and capacitance (RLGC) values were calculated. Following, electromagnetic simulations were performed for comparison using ANSYS high-frequency structure simulator (HFSS). The per-unit-length RLGC values for the through substrate vias with $SiO_2$ liner and PEVs are shown in FIG. 7a-7d; copper vias were 70 μm in diameter and on a 150-μm pitch. The thickness of the $SiO_2$ liner was 1 μm. The relative dielectric constants of silicon and $SiO_2$ were 11.68 and 3.9, respectively; silicon resistivity was 10 Ωcm. Moreover, with respect to the properties of SU-8, broadband $\varepsilon_r$ and tan δ characterizations can be obtained using techniques such as microstrip transmission lines, conductor-backed coplanar waveguide transmission lines, microstrip ring resonators, and T resonators. Known broadband $\varepsilon_r$ and tan δ values up to 210 GHz are close to 3 and 0.04, respectively, and were used FIGS. 7a-7d are graphical representations evaluating per-unit-length photo-defined through substrate via RLGC values using models and HFSS simulations, in accordance with an embodiment of the present disclosure. In FIG. 7a, the HFSS Simulation for PEVs is the top-most line (as determined from the right of the graph); the HFSS simulation for vias with an oxide liner is the middle-most line, and the visible hashed line is model PEVs. In FIG. 7b, the top-most line shows the HFSS simulation for PEVs; the middle-most line is the HFSS simulation for vias with oxide liner; and the bottom-most hashed line is the model PEVs. In FIG. 7c, the top-most hashed line is the model via with oxide liner; the middle-most line is the HFSS simulation for vias with an oxide liner; and the bottom-most line is the HFSS simulation for PEVs. In FIG. 7d, the top most hashed line and solid line are for the HFSS simulation and model for vias with an oxide liner, and the bottom-most solid and hashed line are the HFSS and model for PEVs.

As shown in FIGS. 7c and 7d, PEVs attained 96.2% and 72.8% reduction in conductance and capacitance at 50 GHZ, respectively, compared to through substrate vias with the $SiO_2$ liner and the same copper via dimensions. The reduction in the capacitance and conductance of PEVs provided a low-loss electrical performance.

Fabrication

Figure 8:
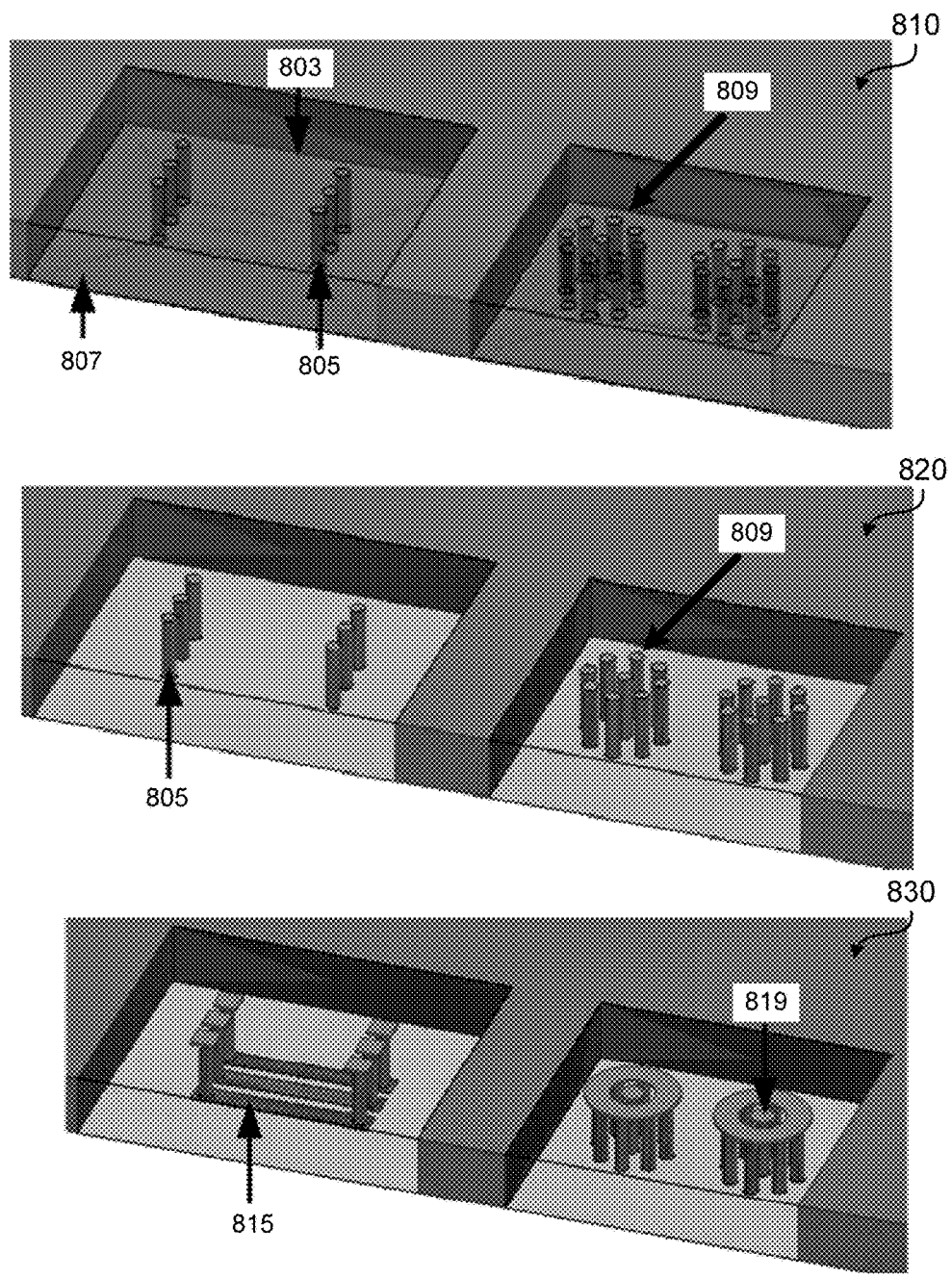
FIG. 8 illustrates a method for fabricating photo-defined vias and coaxial via arrangements in the same substrate, in accordance with an embodiment of the present disclosure.

The fabrication process of the polymer-enhanced through substrate vias under consideration is shown in FIG. 8. The fabrication process begins with the formation of trenches (using the Bosch process) in a silicon wafer containing a copper seed layer at the base. Next, SU-8 coating, photo-definition, via electroplating and chemical-mechanical polishing were performed to obtain copper vias in the photo-defined polymer wells (as shown at 810 and 820). The vias were fabricated in ground-signal-ground (GSG) 805 and coaxial configurations 809. Next, the top and base metallizations were fabricated over the copper vias to attain the following structures (as shown at 830): 1) de-embedding and eye-diagram measurement structures with pads over the vias and traces at the base 815 and 2) coaxial via impedance extraction structures 819.

RF De-Embedding and CG Extraction

Figure 9A:
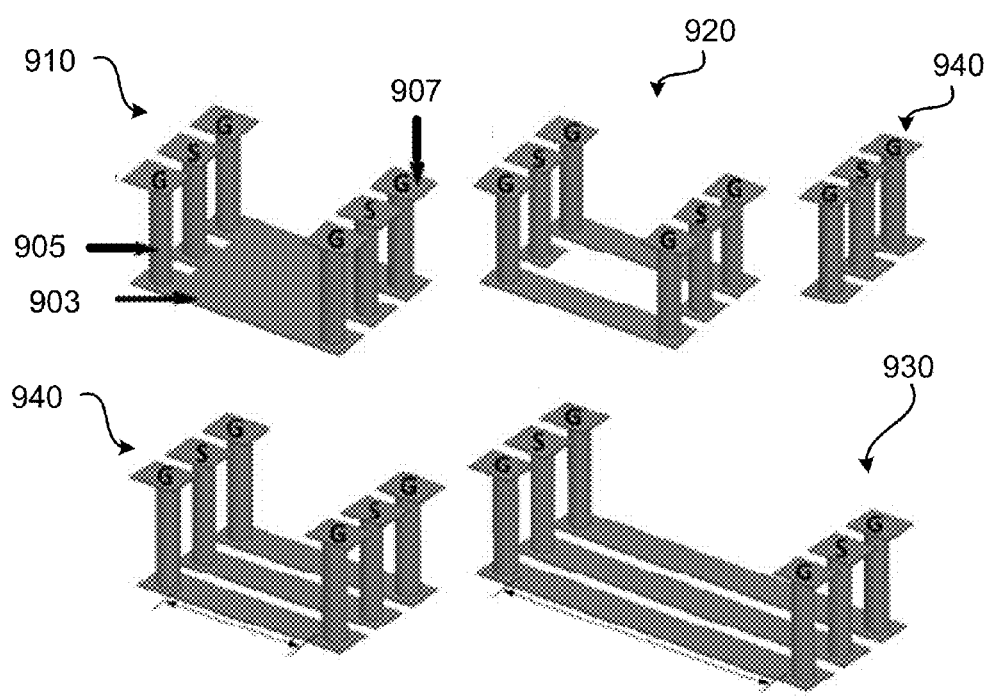
FIG. 9a illustrates various schematics of measured and simulated through substrate via structures for de-embedding from a substrate, in accordance with an embodiment of the present disclosure.

To perform de-embedding of PEVs, two methodologies are implemented: 1) L-2L (930,940) and 2) open-short (910,920). The schematics of the structures fabricated and characterized for de-embedding are shown in FIG. 9a and generally comprise a top metallization portion 907, copper vias 905, and a base metallization 903. A standalone PEV structure 940 is simulated for the sole purpose of benchmarking its results to those obtained from de-embedding. Moreover, a standalone through substrate via structure with $SiO_2$ liner is also simulated (for the comparison of PEVs to the through substrate vias with 1-μm-thick $SiO_2$ liner and 10-Ω·cm silicon resistivity). In the de-embedded through substrate via structures and the standalone structures for benchmarking, the contribution of the top and bottom pads is included owing to the de-embedding methodologies used. With further development in de-embedding methodologies, a de-embedding of through substrate vias without pads can be obtained in the future.

Using the process in FIG. 8, the fabricated PEVs for de-embedding are shown in FIG. 9b-9c. The fabricated vias can be 285-µm tall, 60 µm in diameter, and on a 150-µm pitch within 1800 µm×1800-µm wells; the traces can be 105-µm wide.

For L-2L de-embedding, through substrate via-trace-through substrate via structures with the 400- and 800-µm-long traces between the through substrate vias (with pads) were fabricated, simulated, and measured. The measured and simulated S-parameters of PEVs were converted to A B C D-parameters, and the through substrate via losses are extracted as follows:

$$\text{Chain}L = TSV * \text{Trace} * TSV \quad (1)$$

and $$\text{Chain}2L = TSV * \text{Trace} * \text{Trace} * TSV \quad (2)$$

where ChainL, Chain2L, TSV, and Trace represent the matrices of ABCD-parameters. Moreover, ChainL represents the through substrate via-trace-through substrate via structure with the 400-µm-long traces between the through substrate vias, Chain2L represents the through substrate via-trace-through substrate via structure with the 800-µm-long traces between the through substrate vias, TSV represents the GSG through substrate vias (with pads), and Trace represents the 400-µm-long GSG traces between the through substrate vias.

From (1) and (2)

$$TSV = \sqrt{\text{Chain}L^{-1} * \text{Chain}2L * \text{Chain}L^{-1} {}^{-1}} \quad (3)$$

For open-short de-embedding, the through substrate via-trace-through substrate via structure with the 400-µm-long traces (thru or L structure), and open and short structures with the same distance between the through substrate vias were fabricated, simulated, and measured.

The open-short technique provides the losses of the traces at the base of the thru structure, which is followed by the extraction of the losses of GSG through substrate vias using AB CD matrices. First, the S-parameters of the open, short, and thru structures are converted to Y-parameters to evaluate the following matrices:

$$\text{Matrix}1_Y = \text{Thru}_Y - \text{Open}_Y \quad (4)$$

and $$\text{Matrix}2_Y = \text{Short}_Y - \text{Open}_Y \quad (5)$$

Next, the evaluated Y-parameter matrices are converted to Z-parameter matrices, and the Z-parameters of the traces at the base of the thru structure are obtained as follows:

$$\text{Trace}_Z = \text{Matrix}1_Z - \text{Matrix}2_Z \quad (6)$$

Once the Z-parameters of the trace are obtained, they are converted to ABCD-parameters to extract the through substrate via losses from the thru structure as follows:

$$TSV = \sqrt{\text{Thru} * \text{Trace} * \text{Trace}^{-1}} \quad (7)$$

To extract the through substrate via losses, RF measurements were performed up to 30 GHz using a probe station with a Keysight N5245A PNA-X network analyzer and Cascade MicroTech 150-µm pitch |Z| probes. Prior to measurements, calibration was performed using the line-reflect-reflect-match protocol. The de-embedded through substrate via measurements are compared with HFSS simulations.

Figure 10A:
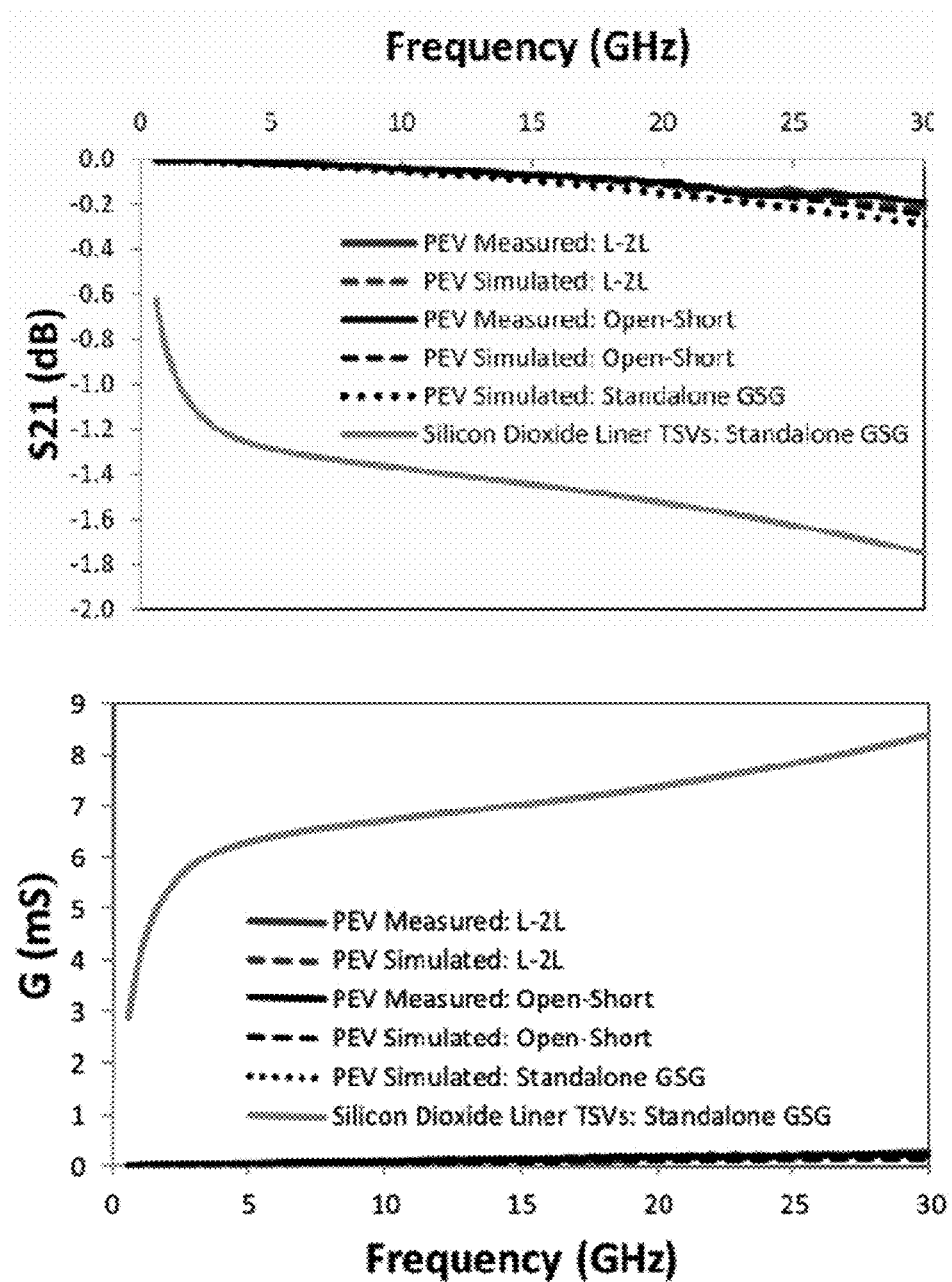
FIGS. 10a-10b are graphical representations demonstrating RF losses for de-embedded via structures and CG extractions, in accordance with an embodiment of the present disclosure.
Figure 10B:
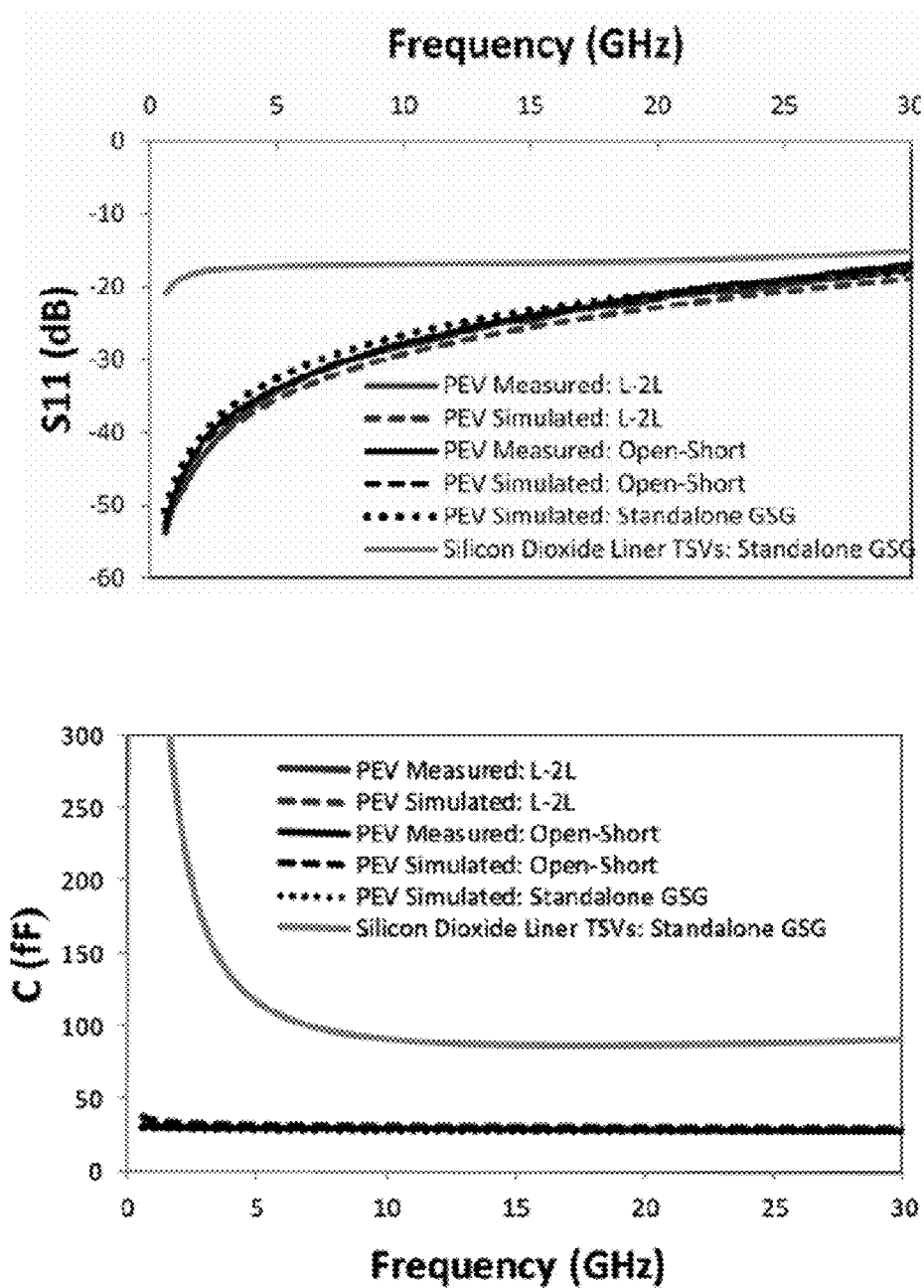

FIGS. 10a-10b are graphical representations demonstrating RF losses for de-embedded via structures and CG extractions, in accordance with an embodiment of the present disclosure. As shown in FIG. 10a, the via losses attained from both de-embedding techniques are in good agreement up to 30 GHz with minor difference between the de-embedded and the standalone through substrate via loss. The de-embedding results from the measurements yield 0.22-dB insertion loss per PEV at 30 GHz. Compared with the simulated insertion loss of a standalone through substrate via with SiO$_2$ liner, 87% reduction in insertion loss can be obtained using the PEVs at 30 GHz.

Moreover, since the key contribution to the low-loss behavior of PEVs results from the reduced capacitance and conductance compared with the through substrate vias with SiO$_2$ liner (FIGS. 11a-11c), capacitance and conductance of the de-embedded GSG PEVs are extracted using Y-parameters (obtained from the measured and simulated S-parameters). The C and G extractions demonstrate a significant reduction in the capacitance and conductance for PEVs, as shown in FIG. 10b Eye-Diagram Characterization Eye diagrams assess intersymbol interference, jitter, and skew, and can thereby provide insight into through substrate via link performance. For through substrate via eye-diagram measurements, a setup, including an Anritsu MP1761C pulse pattern generator and an Agilent DCA-X 86100D oscilloscope, was used with Cascade MicroTech 150-µm and 200-µm pitch |Z| probes. The measurements were performed with a 0.7 V (limited by the oscilloscope measurement capability) pseudorandom bit sequence (PRBS) of $2^{11}-1$.

Figure 11A:
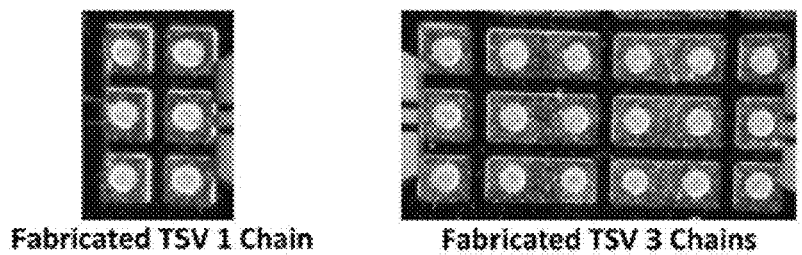
FIGS. 11a-11c show various time-domain measurements and extractions in Advanced Design System (ADS) using RF measurements of through substrate vias with a silicon dioxide liner, in accordance with an embodiment of the present disclosure.
Figure 11B:
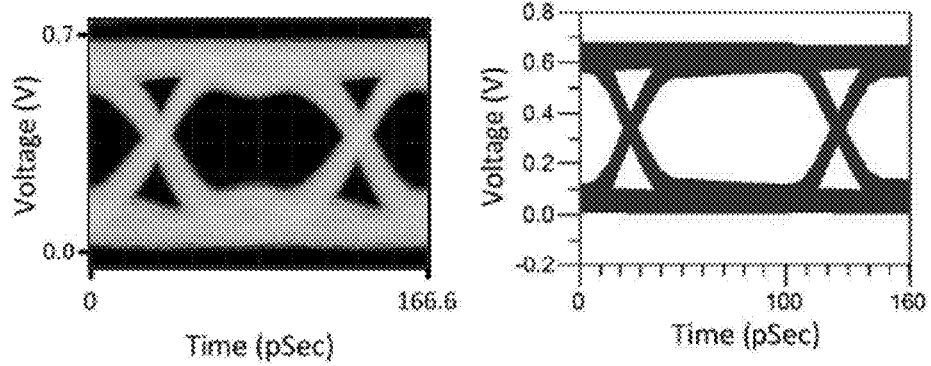
Figure 11C:
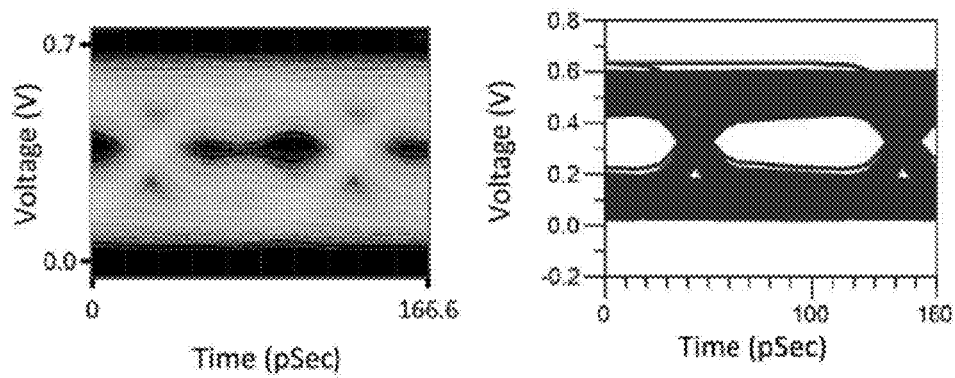
Figure 12A:
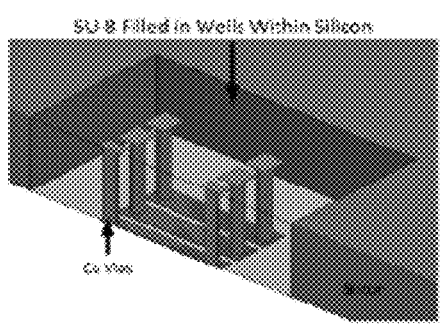
FIGS. 12a-12f show various measured eye diagrams of polymer-embedded vias with constructed eye diagrams in ADS using the RF measurements of polymer-embedded via chains and through substrate vias with silicon dioxide liner for benchmarking, in accordance with an embodiment of the present disclosure.
Figure 12B:
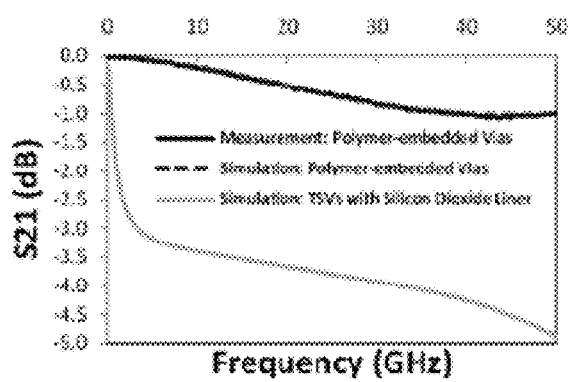
Figure 12C:
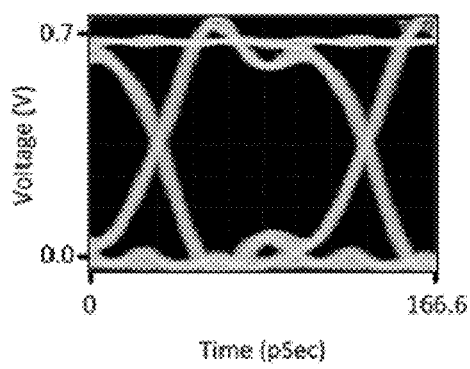
Figure 12D:
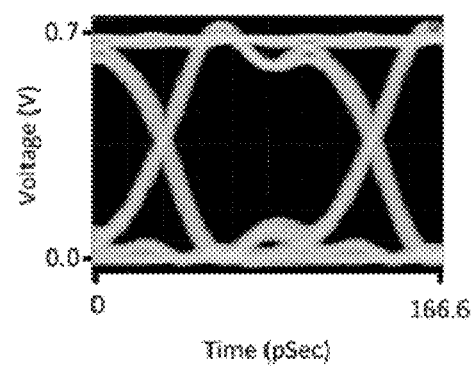
Figure 12E:
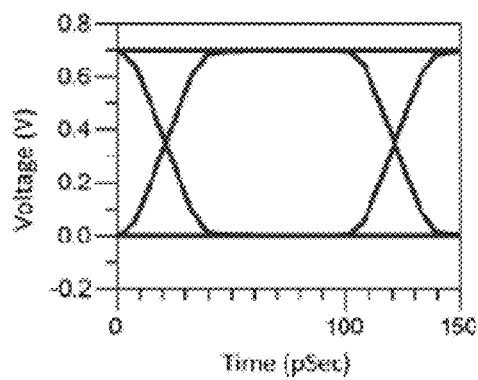
Figure 12F:
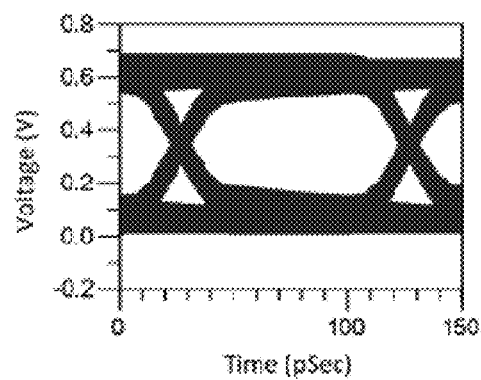

To perform the eye-diagram characterization of the fabricated PEVs, first, the measurements of chains of through substrate vias with SiO$_2$ liner were performed; the through substrate vias are 88 µm in diameter, 300-µm tall, and formed on a 250-µm pitch with the 1-µm-thick SiO$_2$ liner. The measured eye diagrams at 10 Gb/s for one and three chains of through substrate vias are shown in FIG. 11a.

To better understand the eye-diagram measurements, S-parameter measurements of the through substrate via chains were performed first and imported in Keysight's Advanced Design System (ADS) to obtain eye-diagram extractions using a transient analysis. For the transient analysis, a PRBS voltage source (VtPRBS) was applied at the input (with an internal 50-Ω impedance in series corresponding to a pattern generator), and a 50-Ω termination impedance is used at the output (corresponding to an oscilloscope) of the through substrate via chains. With the source and termination 50-Ω impedances, the VtPRBS generates a 0.7 V peak-to-peak PRBS of $2^{11}-1$ with a rise-and-fall time of 30 ps. The extracted eye diagrams in ADS exhibit trends and eye openings similar to the time-domain measurements. The measurements show an additional loss from cables and probes compared with the extraction yielding smaller eye openings.

Next, the eye-diagram measurements of the fabricated PEVs [the L or Thru structure in FIG. 9a] were explored. Before performing the eye-diagram measurements, loop-back measurements with a direct connection of the pattern generator to the oscilloscope were performed. Next, similar eye-diagram measurements were performed (for the fabricated PEVs) to the through substrate vias with SiO$_2$ liner, as shown in FIG. 12a-12f. Moreover, using the eye-diagram extraction methodology in Keysight's ADS, eye diagrams were generated from the RF measurements of the fabricated PEVs and from the HFSS simulations of the through substrate vias with 1-µm-thick SiO$_2$ liner (10 Ω·cm silicon resistivity) and the same copper via dimensions. The PEV measurements demonstrate a minimal eye closing compared with the loop-back measurements and improved eye openings and timing jitters compared with the through substrate vias with SiO$_2$ liner.

Polymer-Enhanced Coaxial Vias

Figure 13A:
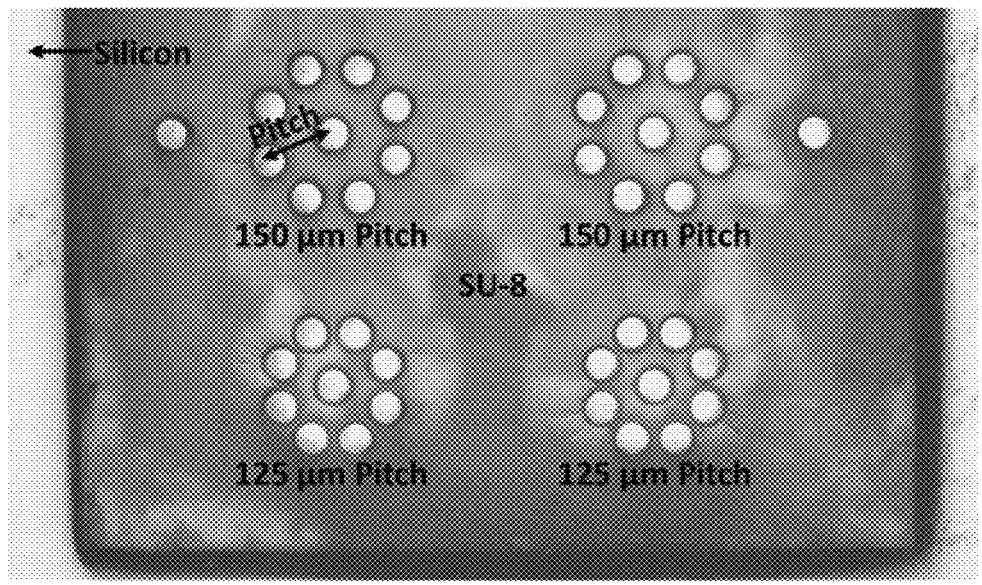
FIGS. 13a-13b show a top view of the fabricated through substrate vias and a graphical representation of extracted impedance measurements respectively, in accordance with an embodiment of the present disclosure.

The fabrication process of coaxial vias is shown in FIG. 8. FIG. 13a shows the fabricated 285-µm-tall polymer-enhanced coaxial vias within an 1800-µm×1800-µm well in a silicon wafer (prior to the top layer metallization). The copper via diameter is 65 µm, and the signal-to-ground via pitches were 150 and 125 µm (i.e., two different coaxial vias).

Figure 13B:
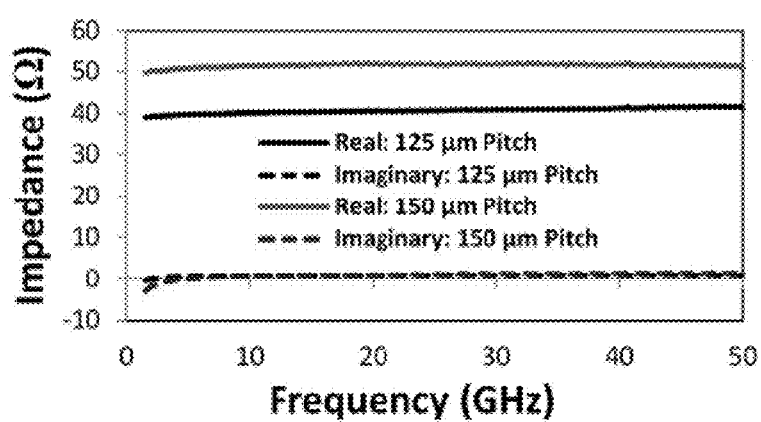

The coaxial structure with the top metallization (FIG. 8) yielded an electrically open structure for single-port measurements. Fabricating a copper layer at the base of the open structure yielded an electrically short structure for single-port measurements. Using the open and short structures, high-frequency single-port measurements were performed from 1 GHz to 50 GHz. Using the measured S-parameters of the fabricated coaxial vias, Z-parameters and Y-parameters were obtained with 50Ω as the reference impedance. Using the Z-parameters of the short structure, R and L are extracted, using the Y-parameters of the open structure, C and G are extracted. Using the extracted RLGC, impedance is evaluated, as shown in FIG. 13b, demonstrating a wideband impedance matching to approximately 50Ω using the 150-µm pitch vias and approximately 40Ω using the 125-µm pitch vias.

Discussion

The above demonstrates the fabrication and characterization of photodefined PEVs and coaxial through substrate vias for mixed-signal heterogeneous integration using silicon interposers. RF analysis, fabrication, de-embedding up to 30 GHz, and eye-diagram measurements are demonstrated for PEVs, showing their enhanced electrical performance compared with the through substrate vias with SiO$_2$ liner. Moreover, fabrication and impedance extraction are demonstrated for coaxial through substrate vias showing wideband impedance matching.

We claim:

1. A mixed-signal substrate providing multi-modal communication comprising:
   three trenches each extending through the substrate from an upper surface of the substrate to a lower surface of the substrate; the substrate comprises low-resistivity silicon;
   a photodefineable polymer extending the length of each trench and filling at least a portion of each trench; and
   a conductive material extending the length of the trench and filling at least a portion of two trenches to form through-substrate vias;
   wherein a first trench of the three trenches is configured to provide a first mode of communication;
   wherein a second trench of the three trenches is configured to provide a second mode of communication and includes a different number of through-substrate vias than a third trench of the three trenches; and wherein the third trench is configured to provide a third mode of communication;
   wherein the first mode of communication is optical;
   wherein the second mode of communication is DC; and
   wherein the third mode of communication is radio frequency.

2. The mixed-signal substrate of claim 1, wherein the through-substrate via arrangements of the second trench are selected from the group consisting of a post via arrangement, and a via bundle; and
wherein the through-substrate via arrangements of the third trench are selected from the group consisting of a coaxial via arrangement having a solid ring via, and a coaxial via arrangement having a meshed via ring.

3. The mixed signal substrate of claim 1, wherein the third trench includes a first through-substrate via having a different two-dimensional shape than a second through-substrate via in the second trench.

4. The mixed-signal substrate of claim 1, wherein the second trench comprises a via bundle metal-plated to form a high-density decoupling capacitor.

5. The mixed-signal substrate of claim 1, wherein the conductive material of the through-substrate vias is selected from the group consisting of a metal and a high-k dielectric material.

6. The mixed-signal substrate of claim 1, wherein a through-substrate via in the third trench has a greater width than a through-substrate via in the second trench.

7. The mixed-signal substrate of claim 1, wherein the third trench comprises a coaxial via arrangement.

8. The mixed-signal substrate of claim 7, wherein the coaxial via arrangement comprises an inner through-substrate via and a plurality of outer through-substrate vias, the plurality of outer through-substrate vias disposed coaxially around the inner through-substrate via.

9. The mixed-signal substrate of claim 1 further comprising one or more through substrate vias coated in silicon dioxide.

10. The mixed-signal substrate of claim 1, wherein the second trench comprises a post via arrangement, including a central through-substrate via having a liner comprising the photodefineable polymer.

11. A method of fabricating the mixed-signal substrate of claim 1 comprising:
    etching the trenches in the substrate;
    filling at least a portion of each of the trenches with the photodefineable polymer;
    patterning the photodefineable polymer in each of the trenches, the patterning comprising forming one or more channels within the photodefineable polymer layer filling at least a portion of two of the trenches; and
    filling at least a portion of one or more channels with the conductive material to form one or more through-substrate vias;
    wherein patterning the photodefineable polymer comprises patterning a different arrangement of channels in the third trench than the second trench.

12. The method of claim 11, wherein etching the trenches in the substrate comprises one of dry-etching or wet-etching.

13. The method of claim 11, wherein one trench includes a different number of channels than another trench.

14. A mixed-signal substrate providing multi-modal communication comprising:
    a first through-substrate trench configured to provide a first mode of communication;
    a second through-substrate trench configured to provide a second mode of communication; and
    a third through-substrate trench configured to provide a third mode of communication;
    wherein each through-substrate trench extends through a substrate from an upper surface of the substrate to a lower surface of the substrate;
    wherein each through-substrate trench comprises a photodefineable polymer extending the length of the trench and filling at least a portion of the trench;
    wherein the first mode of communication is optical;

wherein the second through-substrate trench further comprises conductive material extending the length of the trench and filling at least a portion of the trench to form a through-substrate via; and wherein the third through-substrate trench further comprises a coaxial arrangement of conductive material extending the length of the trench and filling at least a portion of the trench to form a coaxial arrangement of through-substrate vias.

15. The mixed-signal substrate of claim 14, wherein the third through-substrate trench forms a high-density decoupling capacitor.

16. The mixed-signal substrate of claim 14, wherein the coaxial arrangement of through-substrate vias of the third through-substrate trench comprise a center rod of conductive material and an annular ring of conductive material spaced apart from the center rod.

17. The mixed-signal substrate of claim 14, wherein the coaxial arrangement of through-substrate vias of the third through-substrate trench comprise an inner through-substrate via and a plurality of outer through-substrate vias, the plurality of outer through-substrate vias disposed coaxially around the inner through-substrate via.

18. The mixed-signal substrate of claim 14, wherein the second mode of communication is DC; and wherein the third mode of communication is radio frequency.

* * * * *